United States Patent
Dubois et al.

(10) Patent No.: US 9,891,587 B2
(45) Date of Patent: Feb. 13, 2018

(54) COMPOSITE COMPONENT WITH STRESSED RESILIENT MEANS

(71) Applicant: Nivarox-FAR S.A., Le Locle (CH)

(72) Inventors: Philippe Dubois, Marin (CH); Yves Winkler, Schmitten (CH)

(73) Assignee: Nivarox—FAR S.A., Le Locle (CH)

( * ) Notice: Subject to any disclaimer, the term of this patent is extended or adjusted under 35 U.S.C. 154(b) by 0 days.

(21) Appl. No.: 15/340,288

(22) Filed: Nov. 1, 2016

(65) Prior Publication Data
US 2017/0176935 A1 Jun. 22, 2017

(30) Foreign Application Priority Data
Dec. 17, 2015 (EP) .................................... 15200698

(51) Int. Cl.
| | |
|---|---|
| *G04B 1/16* | (2006.01) |
| *G04B 13/02* | (2006.01) |
| *B22D 19/04* | (2006.01) |
| *C22C 45/10* | (2006.01) |
| *C22C 45/00* | (2006.01) |

(52) U.S. Cl.
CPC .............. *G04B 1/16* (2013.01); *B22D 19/04* (2013.01); *G04B 13/022* (2013.01); *G04B 13/026* (2013.01); *C22C 45/003* (2013.01); *C22C 45/10* (2013.01)

(58) Field of Classification Search
CPC ........ G04B 1/16; G04B 13/02; G04B 13/021; G04B 13/022; G04B 13/026; B22D 19/04; C22C 45/003; C22C 45/10
See application file for complete search history.

(56) References Cited

U.S. PATENT DOCUMENTS

| | | | |
|---|---|---|---|
| 2012/0159766 A1* | 6/2012 | Verardo | ................. G04B 13/02 29/520 |
| 2012/0159767 A1* | 6/2012 | Verardo | .............. G04B 13/022 29/520 |

FOREIGN PATENT DOCUMENTS

CH        706 645 A1    12/2013

OTHER PUBLICATIONS

European Search Report (with Written Opinion) dated Jun. 16, 2016 in European Application 15200698.7 filed on Dec. 17, 2015 (with English Translation of Categories of Cited Documents).

* cited by examiner

*Primary Examiner* — Vit W Miska
(74) *Attorney, Agent, or Firm* — Oblon, McClelland, Maier & Neustadt, L.L.P.

(57) ABSTRACT

The invention relates to a composite component comprising an element with an opening into which extend stressed resilient means confined within a volume of an at least partially amorphous metal alloy, said composite component comprising a passage that, is centered with respect to said stressed resilient means.

27 Claims, 6 Drawing Sheets

COMPOSITE COMPONENT WITH STRESSED RESILIENT MEANS

This application claims priority from European Patent Application No. 15200698.7 of Dec. 17, 2015, the entire disclosure of which is hereby incorporated herein by reference.

FIELD OF THE INVENTION

The invention relates to a timepiece assortment using an amorphous metal alloy and particularly such an assortment including a timepiece component whose material has no usable plastic range, i.e. with a very limited plastic range.

BACKGROUND OF THE INVENTION

Current assemblies including a silicon-based part are generally secured by adhesive bonding. This type of operation requires extremely delicate application which makes it expensive.

SUMMARY OF THE INVENTION

It is an object of the present invention to overcome all of part of the aforecited drawbacks fey proposing a timepiece assortment that does not use adhesive to fix or secure, in particular, a component made of brittle material to an arbor.

To this end, the invention relates to a method for fabrication of a composite component including the following steps:
a) forming an element with an opening into which resilient means extend;
b) placing a tool between the resilient means of the element so as to place the resilient means under stress;
c) overmoulding the element with an at least partially amorphous metal alloy so as to confine the resilient means under stress;
d) removing the tool to form the composite component provided with a passage of corresponding shape to said tool between the resilient means.

The method thus allows a perfectly automatically centred composite component to be obtained. Indeed, the overmoulding step makes it possible to keep the resilient means with a centring stress on the tool which guarantees a very high positioning precision.

Further, the overmoulding makes it possible to protect the element against plastic deformation which permits the use of a "brittle" material. Thus, the composite component obtained from the method can be driven, i.e. press-fitted, onto a metal arbor with very little risk of breakage even if the element is, for example, silicon-based. In fact, it is the at least partially amorphous metal alloy portion that may potentially be plastically deformed.

Finally, the use of an at least partially amorphous metal alloy makes disassembly possible after fabrication of the composite component or after press-fitting the composite component. Indeed, an at least partially amorphous metal alloy can advantageously be heated to a predetermined temperature which makes it soft enough to have no mechanical resistance.

In accordance with other advantageous variants of the invention:
the resilient means form at least two deformable strips connected in one-piece to the wall of the opening in the element;
at least one end of one of said at least two deformable strips is connected in one-piece to at least one end of another of said at least two deformable strips;
said at least two interconnected deform able strips form a V-shaped structure, a polygon or a Y-shaped structure;
in step c), an at least partially amorphous metal alloy blank is heated between its glass transition temperature ($T_g$) and its crystallization temperature ($T_x$) in order to overmould said resilient means;
in step c), the at least partially amorphous metal alloy overmould forms a protruding portion of the element so as to provide a thickness of the composite component that is formed entirely of at least partially amorphous metal alloy;
in step c), a mould is placed on the element to delimit the area of the element that can be overmoulded with the at least partially amorphous metal alloy.

Further, the invention relates to a composite component comprising an element with an opening into which extend stressed resilient means confined within a volume of an at least partially amorphous metal alloy, said composite component comprising a passage that is centred with respect to said stressed resilient means.

The embedded resilient means make it possible to obtain a perfectly automatically centred passage. Indeed, because the resilient means are overmoulded while under stress from a tool, they can guarantee a very high positioning precision.

Additionally, even if the element: were accidentally broken at one of its resilient means, for example, by a shock to the timepiece, holding would still be ensured by the overmoulding. Any portions of the element which might get broken would in fact be held in place by the overmoulding, thus preventing the release thereof into the timepiece movement.

Finally, the use of an at least partially amorphous metal alloy allows for disassembly of the composite component. Indeed, an at least partially amorphous metal alloy can advantageously be heated to a predetermined temperature which makes it soft enough to have no mechanical resistance.

In accordance with other advantageous variants of the invention:
the resilient means form at least two deformable strips connected in one-piece to the wall of the opening in the element;
at least one end of one of said at least two deformable strips is connected in one-piece to at least one end of another of said at least two deformable strips;
said at least two interconnected deform able strips form a V-shaped structure, a polygon or a Y-shaped structure;
the volume of at least partially amorphous metal alloy forms a protruding portion of the element so as to provide a thickness of the composite component formed entirely of at least partially amorphous metal alloy;
the element includes doped or undoped single crystal silicon, doped or undoped polycrystalline silicon, silicon oxide, quartz, silica, single crystal corundum, polycrystalline corundum, alumina, ruby, silicon nitride or silicon carbide;
the element includes at least a partial coating of silicon oxide, silicon nitride, silicon carbide or an allotrope of carbon;
the volume of at least partially amorphous metal alloy is formed from a magnesium-based, titanium-based, zirconium-based, iron-based, cobalt-based, gold-based, palladium-based or platinum-based alloy;

the volume of at least partially amorphous metal alloy is formed by an alloy of the ZrTiCuNiBe, PdCuNiP or PtCuNiP type.

Finally, the invention relates to an assortment comprising an arbor driven into the passage of a composite component according to any of the preceding variants.

It is thus understood that the composite component has an improved holding force on the arbor. Thus, the arbor driven into the composite component has a much higher stiffness than that of simple resilient structures of the same element without overmoulding. Further, the holding torque is a function of the pressure exerted by the deformed material of the hole on the arbor. It is thus clear that this pressure is considerably higher in the ease of the composite component.

Further, the volume of at least partially amorphous metal alloy protects the element against plastic deformations, which allows for the use of "brittle" material. Thus, the composite component can be driven, i.e. press-fitted, onto a metal arbor with very little risk of breakage even if the element is, for example, silicon-based. In fact, it is the at least partially amorphous metal alloy volume that may potentially be plastically deformed.

Finally, the use of an at least partially amorphous metal alloy allows for disassembly of the assortment. Indeed, an at least partially amorphous metal alloy can advantageously be heated to a predetermined temperature which makes ft soft enough to have no mechanical resistance.

In accordance with other advantageous variants of the invention:
- the arbor is arranged only to be pressed against the volume of at least partially amorphous metal alloy of the composite component;
- the passage is arranged so that the arbor is only pressed against the volume of at least partially amorphous metal alloy of the composite component;
- the composite component is locked against a shoulder of the arbor;
- the assortment forms all or part of a gear train, an escapement system or a resonator of a timepiece.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

Figure 1:
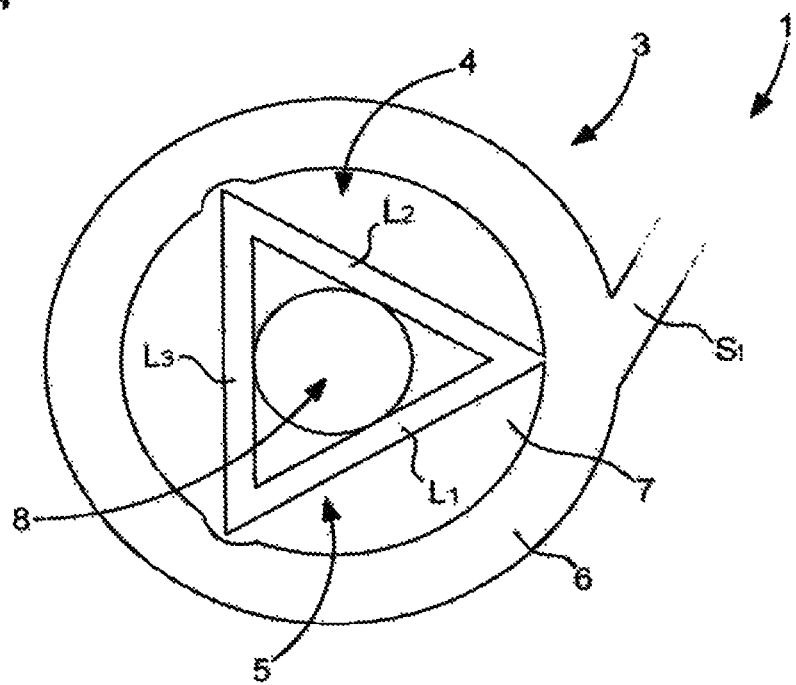
FIG. 1 is a top view of a composite component according to the invention.

The invention relates to a composite component and to an assortment including such a composite component for a timepiece using an amorphous metal alloy. More specifically, the composite component includes an element made of a material with no usable plastic range, i.e. with a very limited plastic range.

This material may, in a non-limiting manner, be doped or undoped single crystal silicon, doped or undoped polycrystalline silicon, silicon oxide, quartz, silica, single crystal corundum, polycrystalline corundum, alumina, ruby, silicon nitride or silicon carbide. The material may include at least a partial coating of silicon oxide, silicon nitride, silicon carbide or an allotrope of carbon. Of course, other types of material such as other ceramics may be envisaged, as may other types of coating.

As explained above, current assemblies comprise an increasing number of silicon-based components and are generally joined by adhesive bonding. This is why the composite component of the invention was developed to form all or part of a gear train 101, of an escapement system 103 or of a resonator 105. However, other applications are possible, not only in the field of watchmaking, without departing from the scope of the present invention.

By way of non-limiting examples, the composite component may thus form a wheel 102, a pinion 104, an oscillating weight a spring (such as for example a mainspring), an escape wheel 107, a lever 108 of a pallet-lever 109, a guard pin 110 of a pallet-lever 109, a fork 111 of a pallet-lever 109, a balance 113, a roller (such as for example a double roller holding an impulse pin) or a balance spring 115. In the Figures, a collet of a timepiece balance spring will be used to better compare the alternatives and the embodiments described.

Figure 2:
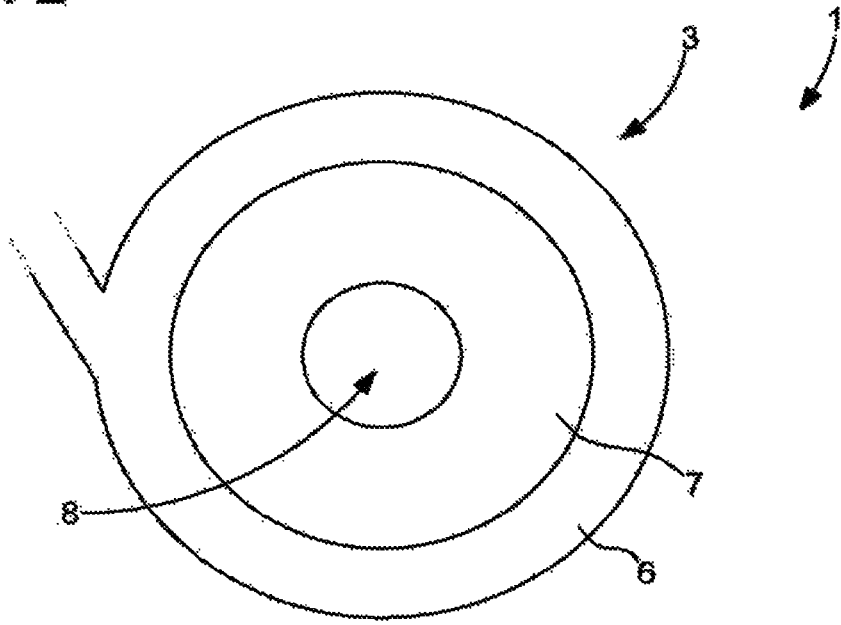
FIG. 2 is a bottom view of a composite component according to the invention.
Figure 3:
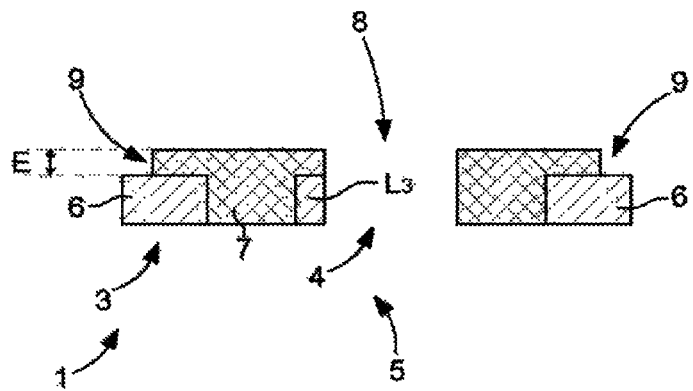
FIG. 3 is a cross-sectional view of a composite component according to the invention.

As illustrated in FIGS. 1 to 3, the invention relates to a composite component 1 comprising an element 3 with an opening 4. As explained above, element 3 may advantageously be formed by a material which has no usable plastic range, i.e. with a very limited plastic range, such as, for example, a silicon-based material.

According to the invention, resilient means 5, i.e. resilient structures capable of elastic deformation, which are preferably in one-piece with the wall surrounding opening 4 of composite component 3, extend into opening 4. In the example seen in FIGS. 1 to 3, element 3 thus includes a substantially annular collet 8 in one-piece with an inner coil $S_1$ of a balance spring and whose opening 4 contains resilient means 5.

Preferably, the resilient means according to the invention form at least two deformable strips connected in one-piece to the wall of the opening in the element. Thus in the example of FIG. 1 resilient means 5 comprise three deformable strips $L_1$, $L_2$, $L_3$ connected to each other to form a one-piece triangle joined to the inner wall of collet 6 at the junction between strips $L_1$ and $L_2$.

Advantageously according to the invention as explained below, the stressed, i.e. elastically deformed, resilient means 5 are confined within a volume 7 of at least partially amorphous metal alloy. It is also seen that a passage 8, i.e. an area without material, is present in composite component 1. Advantageously according to the invention, passage 8 is centred with respect to resilient means 5 as a result of their stressed state, as will be explained further below.

In the example of FIGS. 1 to 3, if can also be seen that volume 7 of at least partially amorphous metal alloy forms a protruding portion 9 of element 3 so as to provide a thickness E of composite component 1 that is formed entirely of at least partially amorphous metal alloy.

Preferably according to the invention, volume 7 of at feast partially amorphous metal alloy is formed from a magnesium-based, titanium-based, zirconium-based, iron-based, cobalt-based, gold-based, palladium-based or platinum-based alloy, for example of the ZrTiCuNiBe, PdCuNiP or PtCuNiP type. The term "at least partially amorphous" means that the metal alloy may be partially or totally in amorphous phase. Preferably at least 20%, more preferably at least 50% and most preferably at least 80% of the metal alloy is in amorphous phase.

It is thus understood that the confined resilient means 5 make if possible to obtain a perfectly automatically centred passage 8. Indeed, because resilient means 5 are confined while under stress, they can guarantee a very high positioning precision.

Further, the use of an at least partially amorphous metal alloy allows for disassembly of composite component 1. In fact volume 7 of at least partially amorphous metal alloy can advantageously be heated to a predetermined temperature which makes it soft enough to have no mechanical resistance, i.e. capable of creeping.

Indeed, the viscosity of an at least partially amorphous metal alloy such as mentioned above, when it is heated between its glass transition temperature and its crystallization temperature, can be decreased to the point that it can creep.

Finally, the press-fit inside composite component 1 has a much higher stiffness than that of simple resilient structures 5 of the same element 3 without overmoulding. Further, the holding torque is a function of the pressure exerted by the deformed material of the hole. It is thus clear that this pressure is considerably higher in the case of composite component 1 according to the invention.

Of course, other alternatives to resilient means 5 and, incidentally, to element 3, are possible. Thus, generally speaking, at least one end of one of said at least two deformable strips is connected in one-piece to at least one end of another of said at least two deformable strips in order to offer centring of the component through deformation of the resilient means.

By way of example, it would be possible to have a passage formed between the inner wall of the collet and resilient means comprising only two deformable strips. It is thus clear that said at least two interconnected deformable strips could form a V-shaped structure.

However, preferably, said at least two interconnected deformable strips form a polygon, i.e. comprise 3 or more interconnected strips, so that the passage is completely surrounded by the resilient means.

Figure 4:
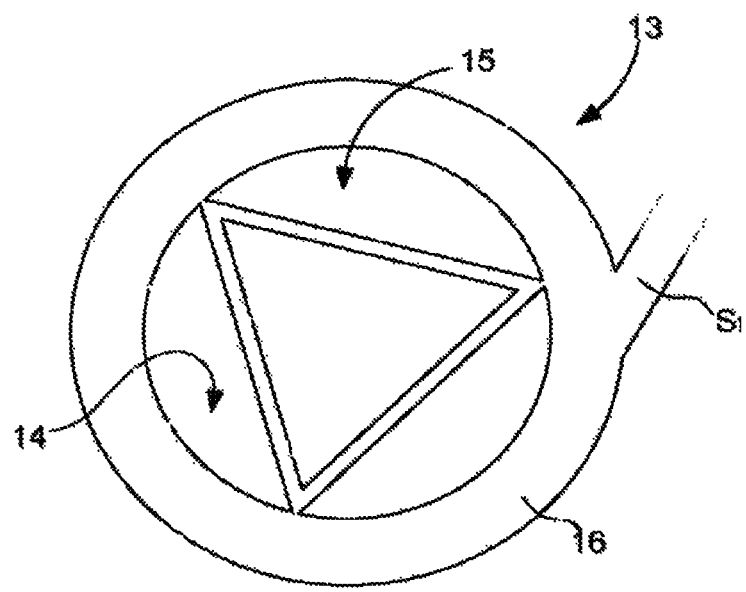
FIGS. 4 to 6 are representations of alternatives of elements according to the invention.

A first alternative element 13 is shown in FIG. 4. Thus, in comparison to FIG. 1, it is seen that resilient means 15 are still mounted inside the opening 14 of a collet 18 and comprise three strips forming a triangle, i.e. three Interlocking V-shaped structures. However, it is noted that, in this first alternative, each apex of the triangle, or each base of the V-shaped structure is connected in one-piece to the inner wail of collet 16.

Figure 5:
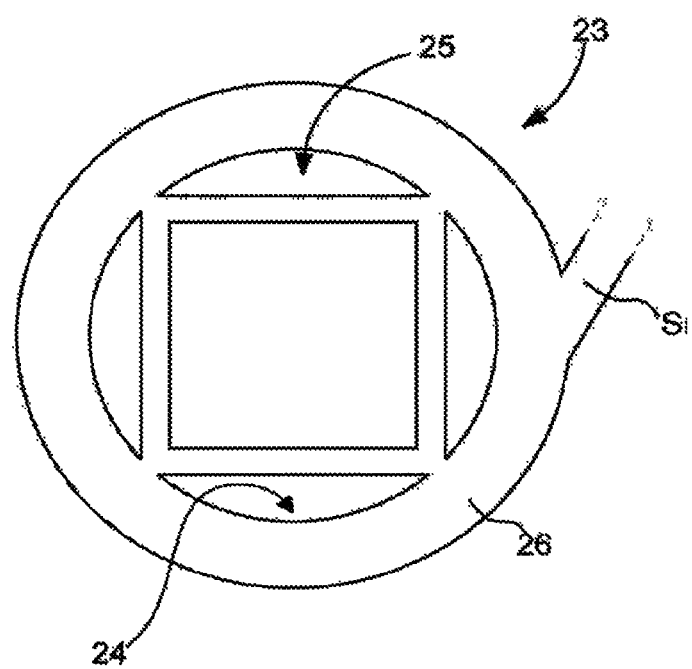
Figure 6:
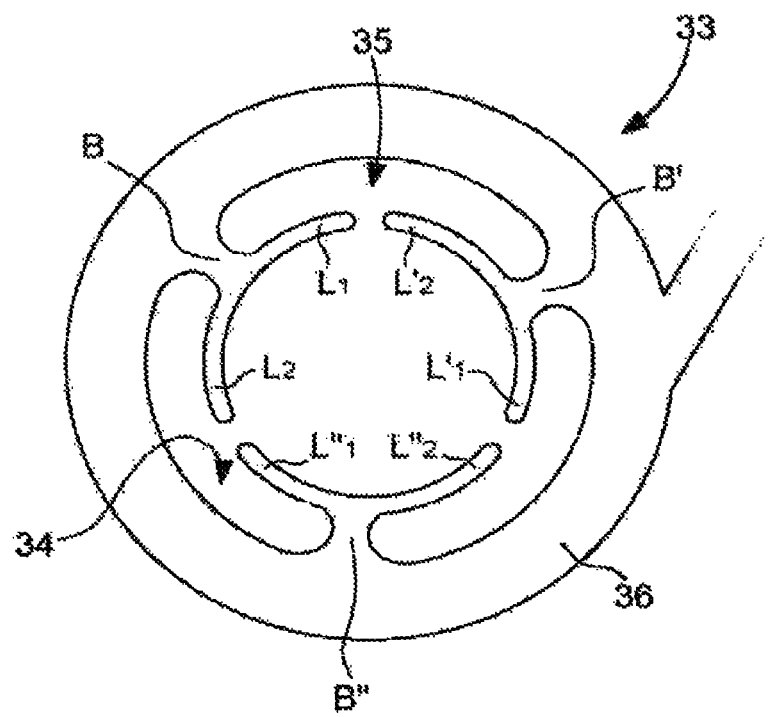
Figure 8:
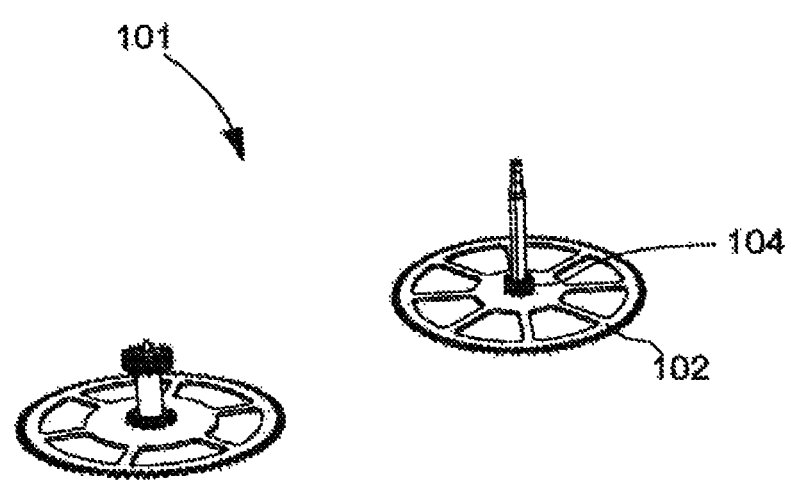
FIG. 8 is a view of a gear train according to the invention.
Figure 7:
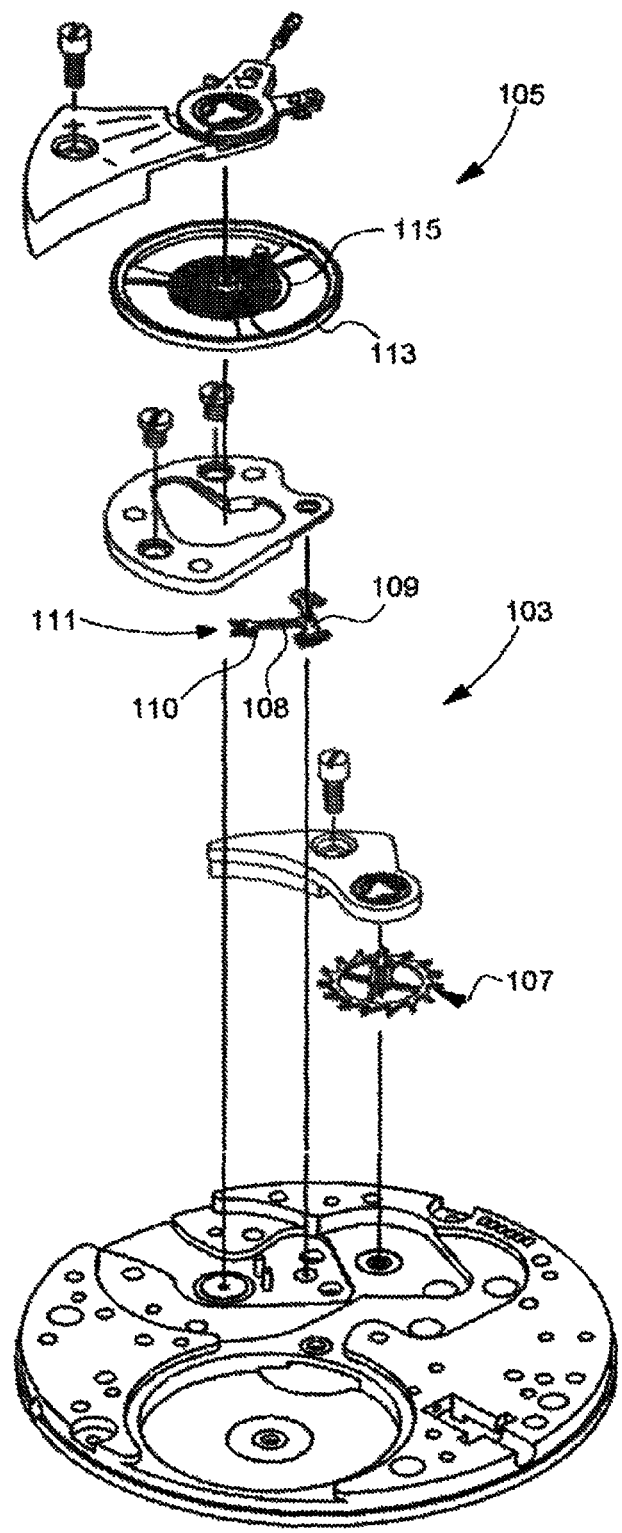
FIG. 7 is an exploded view of a timepiece movement according to the invention.

A second alternative element 23 is shown in FIG. 5. Thus, in comparison to FIG. 1, it is seen that the resilient means 25 are still mounted Inside the opening 24 of a collet 26. However, it is noted that in this second alternative, resilient means 25 comprise four strips forming a square, i.e. four interlocking V-shaped structures. Further, each vertex of the square, or each base of the V-shaped structure, is connected in one-piece to the inner wall of collet 26. p It is also possible to envisage replacing the V-shaped structures with a Y-shaped structure, i.e. a V-shaped structure connected in one-piece via a base. By way of non-limiting example, a third alternative element 33 is thus presented in FIG. 6.

Thus, in comparison to FIG. 1, it is seen that the resilient means 35 are still mounted inside the opening 34 of a collet 36. However, it is noted that in this third alternative, resilient means 35 comprise three Y-shaped structures each comprising two deformable strips $L_1$, $L_2$, $L'_1$, $L'_2$, and $L''_1$, $L''_2$, connected in one-piece to the inner wall of collet 38 by means of a base B, B', B".

Figure 9:
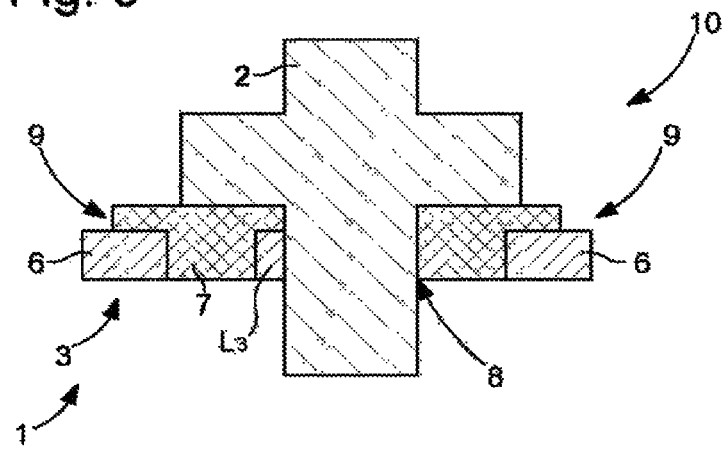
FIG. 9 is a view of an assortment according to a first embodiment of the invention.

Advantageously, the invention also relates to an assortment 10 comprising an arbor 2 driven into the passage 8 of a composite component 1 as seen in FIG. 9. Further, as seen in FIG. 9, composite component 1 may advantageously be locked axially against a shoulder of arbor 2.

It is thus understood that composite component 1 has an improved holding force on the arbor. Thus, arbor 2 driven into composite component 1 has a much higher stiffness than that of simple resilient structures 5 of the same element 3 without overmoulding. Further, the holding torque is a function of the pressure exerted by the deformed material of passage 8 on arbor 2. It is thus clear that this pressure is considerably higher in the case of composite component 1.

Further, volume 7 of at least partially amorphous metal alloy protects element 3 against plastic deformations, which allows for the use of a "brittle" material. Thus, composite component 1 can be driven, i.e. press-fitted, onto a metal arbor 2 with very little risk of breakage even if element 3 is, for example, silicon-based. In fact, it is volume 7 of at least partially amorphous metal alloy that may potentially be plastically deformed.

Additionally, even if element 3 were accidentally broken at one of strips $L_1$, $L_2$, $L_3$ of resilient means for example, by a shock to the timepiece, holding would silt be ensured by the overmoulding. Any portions of element 3 which might get broken would in fact be held in place by the overmoulding, thus preventing the release thereof into the timepiece movement.

Finally, the use of volume of an at least partially amorphous metal alloy allows for disassembly of assortment 10. Indeed, an at least partially amorphous metal alloy can advantageously be heated to a predetermined temperature as explained above, which makes it soft enough to no longer have mechanical resistance.

Figure 10:
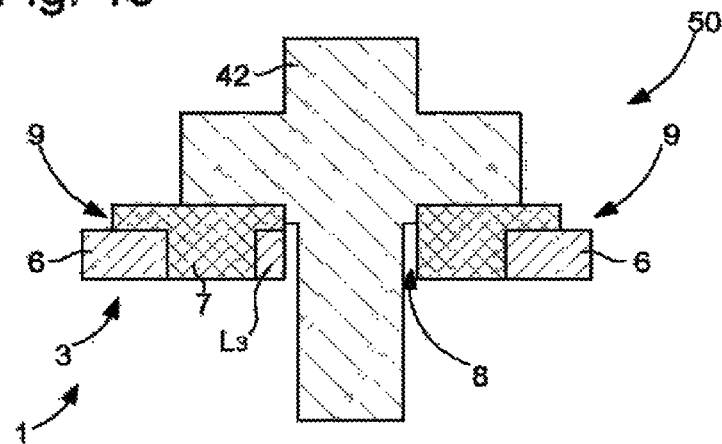
FIGS. 10 to 12 are views of other embodiments of assortments according to the invention.

Of course, embodiments other than assortment 10 are possible. Thus, for example, it might also be desired that resilient means 5, 15, 25, 35 do not touch the arbor. To solve this problem, the arbor and/or the passage could then be arranged only to be pressed against the volume of at least partially amorphous metal alloy of the composite component;

A first alternative embodiment is illustrated in FIG. 10. In this example, assortment 50 comprises an arbor 42 which is thinned to be pressed only against the thickness E of protruding portion 9 of volume 7 of at least partially amorphous metal alloy of composite component 1. As visible in FIG. 10, it can thus be seen that passage 8 of composite component 1 remains not driven in, particularly as regards third strip $L_3$ of resilient means 5.

Figure 11:
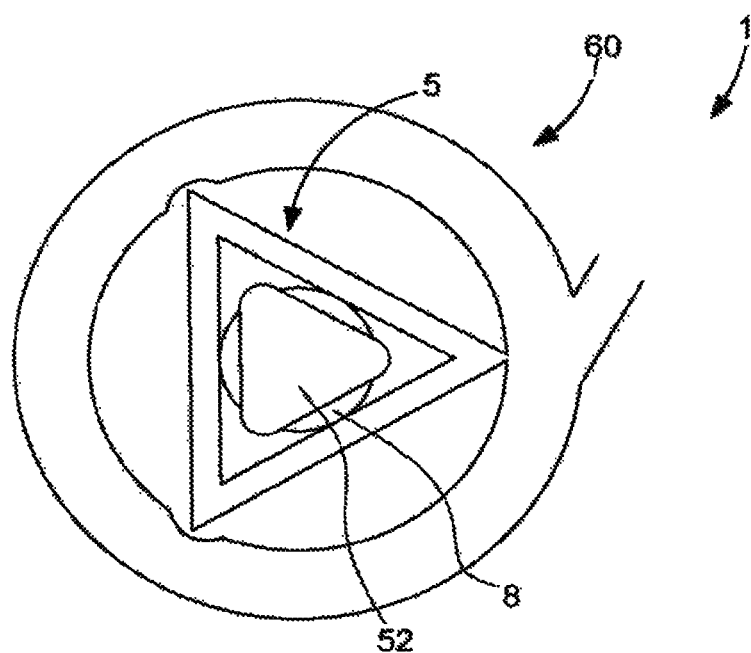

A second alternative embossment is illustrated in FIG. 11. In this example, assortment 60 includes an arbor 52 comprising a cross-section of different shape from that of passage 8 in order to be pressed only against volume 7 of at least partially amorphous metal alloy of composite component 1. As seen in FIG. 11, if can thus be seen that passage 8 of composite component 1 remains not driven in, particularly as regards resilient means 5.

Figure 12:
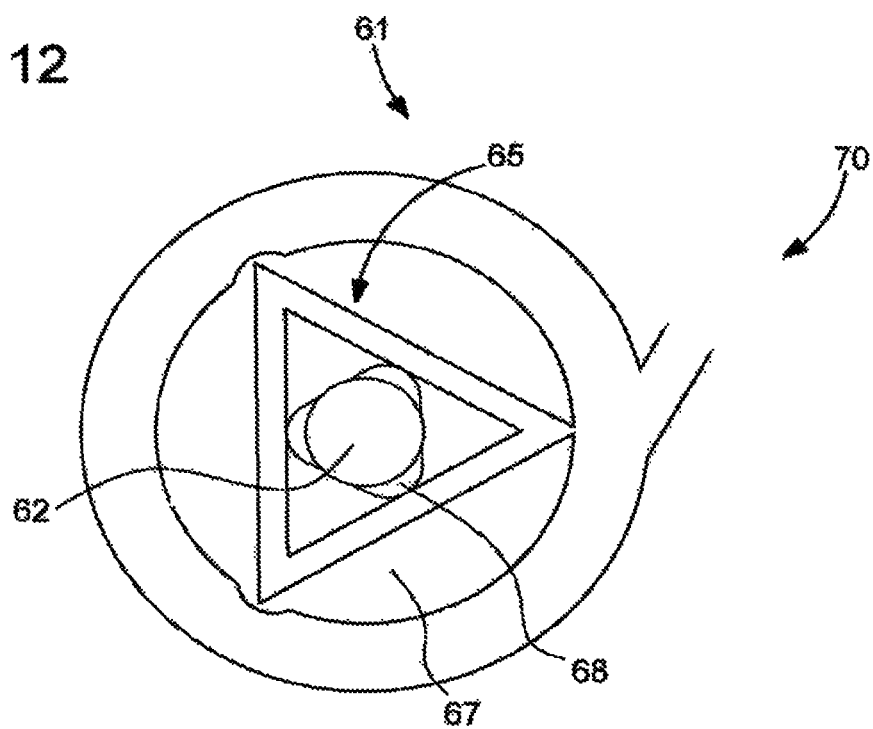

A third alternative embodiment is illustrated in FIG. 12. In this example, assortment 70 comprises a passage 68 having a cross-section of different shape torn that of arbor 82 in order to be pressed only against volume 67 of at least partially amorphous metal alloy of composite component 61. As seen in FIG. 12, it can thus be seen that passage 68 of composite component 61 remains not driven in, particularly as regards resilient means 65.

Of course, the present invention is not limited to the illustrated example but is capable of various variants and modifications that will appear to those skilled in the art. In particular, other types of elements (different resilient means, different application from a collet, etc.) or arbors (arbor without a shoulder, of different cross-section, etc.) can be implemented without departing from the scope of the invention.

An example method for fabrication of a composite component 1, 61 will now be explained. According to the invention, the method for fabrication of a composite component includes a first step a) for forming an element 3, 13, 23, 33 with an opening 4, 14, 24, 34 into which extend resilient means 5, 15, 25, 35, 65.

The method continues with a step b) for placing a tool inside the opening 4, 14, 24, 34 in the element 3, 13, 23, 33 in order to place resilient means 5, 15, 25, 35, 65 under stress. It is thus understood that this tool will form the future passage 8, 68.

The method then includes a step c) for overmoulding element 3, 13, 23, 33 with an at least partially amorphous metal alloy in order to confine the resilient means 5, 15, 25, 35, 65 under stress. To facilitate step c), a mould could be placed on element 3, 13, 23, 33 to better delimit the area of element 3, 13, 23, 33 to be overmoulded with the at least partially amorphous metal alloy. It is understood, in particular, that this mould can very precisely form the protruding portion 9 of element 3 offering a thickness E of composite component 1 made only of at least partially amorphous metal alloy disclosed in FIGS. 1 to 3.

Finally, the method ends with step d) for removing the tool in order to form composite component 1, 61 provided with a passage 8, 68 of corresponding shape to said tool.

Of course, the present invention is not limited to the illustrated example but is capable of various variants and modifications which will appear to those skilled in the art. In particular, indexing means could be provided to perfectly reference the members in relation to each other.

What is claimed is:

1. A method for fabrication of a composite component comprising the following steps:
    a) forming an element with an opening into which resilient means extend;
    b) placing a tool between the resilient means of the element so as to place the resilient means under stress;
    c) overmoulding the element with an at least partially amorphous metal alloy so as to confine the resilient means under stress;
    d) removing the tool to form the composite component provided with a passage of corresponding shape to the tool between the resilient means under stress.

2. The method according to claim 1, wherein the resilient means form at least two deformable strips connected in one-piece to the wall of the opening in the element.

3. The method according to claim 2, wherein at least one end of one of the at least two deformable strips is connected in one-piece to at least one end of another of the at least two deformable strips.

4. The method according to claim 3, wherein the at least two interconnected deformable strips form a V-shaped structure.

5. The method according to claim 3, wherein the at least two interconnected deformable strips form a polygon.

6. The method according to claim 3, wherein the at least two interconnected deformable strips form a Y-shaped structure.

7. The method according to claim 1, wherein, in step c), an at least partially amorphous metal alloy blank is heated between its glass transition temperature and its crystallization temperature in order to overmould the resilient means.

8. The method according to claim 1, wherein, in step c), the at least partially amorphous metal alloy overmould forms a protruding portion of the element so as to provide a thickness of the composite component formed entirely of at least partially amorphous metal alloy.

9. The method according to claim 1, wherein, in step c), a mould is placed on the element to delimit the area of the element that can be overmoulded with the at least partially amorphous metal alloy.

10. A composite component comprising an element with an opening into which extend stressed resilient means confined within a volume of at least partially amorphous metal alloy, the composite component comprising a passage that is centred with respect to the stressed resilient means.

11. The composite component according to claim 10, wherein the resilient means form at least two deformable strips connected in one-piece to the wail of the opening in the element.

12. The composite component according to claim 11, wherein at least one end of one of the at least two deformable strips is connected in one-piece to at least one end of another of the at least two deformable strips.

13. The composite component according to claim 12, wherein the at least two interconnected deformable strips form a V-shaped structure.

14. The composite component according to claim 12, wherein the at least two interconnected deformable strips form a polygon.

15. The composite component according to claim 12, wherein the at least two interconnected deformable strips form a V-shaped structure.

16. The composite component according to claim 10, wherein the volume of at least partially amorphous metal alloy forms a protruding portion of the element so as to provide a thickness of the composite component formed entirely of at least partially amorphous metal alloy.

17. The composite component according to claim 10, wherein the element includes doped or undoped single crystal silicon, doped or undoped polycrystalline silicon, silicon oxide, quartz, silica, single crystal corundum, polycrystalline corundum, alumina, ruby, silicon nitride or silicon carbide.

18. The composite component according to claim 17, wherein the element includes at least a partial coating of silicon oxide, silicon nitride, silicon carbide or an allotrope of carbon.

19. The composite component according to claim 10, wherein the volume of at least partially amorphous metal alloy is formed of a magnesium-based, titanium-based, zirconium-based, iron-based, cobalt-based, gold-based, palladium-based or platinum-based alloy.

20. The composite component according to claim 19, wherein the volume of at least partially amorphous metal alloy is formed by an alloy of the ZrTiCuNiBe, PdCuNiP or PtCuNiP type.

21. An assortment comprising an arbor driven into the passage of a composite component according to claim 10.

22. The assortment according to claim 21, wherein the arbor is arranged only to be pressed against the volume of at least partially amorphous metal alloy of the composite component.

23. The assortment according to claim 21, wherein the passage is arranged so that the arbor is only pressed against the volume of at least partially amorphous metal alloy of the composite component.

24. The assortment according to claim 21, wherein the composite component is locked against a shoulder of the arbor.

25. The assortment according to claim 21, wherein the assortment forms all or part of a gear train of a timepiece.

26. The assortment according to claim 21, wherein the assortment forms all or part of an escapement system (103) of a timepiece.

27. The assortment according to claim 21, wherein the assortment forms all or part of a resonator.

\* \* \* \* \*

UNITED STATES PATENT AND TRADEMARK OFFICE
CERTIFICATE OF CORRECTION

PATENT NO. : 9,891,587 B2
APPLICATION NO. : 15/340288
DATED : February 13, 2018
INVENTOR(S) : Philippe Dubois et al.

It is certified that error appears in the above-identified patent and that said Letters Patent is hereby corrected as shown below:

On the Title Page

Item (57), Abstract, Column 2, Line 5, "that," should read --that--

In the Specification

Column 1, Line 25, second "of" should read --or--

Column 1, Line 26, "fey" should read --by--

Column 2, Line 4, "deform able" should read --deformable--

Column 2, Line 28, "element:" should read --element--

Column 2, Line 49, "deform able" should read --deformable--

Column 3, Line 14, "ease" should read --case--

Column 3, Line 26, "ft" should read --it--

Column 4, Line 16, "Joined" should read --joined--

Column 4, Line 24, "weight" should read --weight,--

Column 4, Line 43, "8" should read --6--

Column 4, Line 66, "feast" should read --least--

Column 5, Line 10, "if" should read --it--

Signed and Sealed this
Twenty-eighth Day of April, 2020

Andrei Iancu
*Director of the United States Patent and Trademark Office*

CERTIFICATE OF CORRECTION (continued)
U.S. Pat. No. 9,891,587 B2

Column 5, Line 16, "fact" should read --fact,--

Column 5, Line 51, 52 approx., "Interlocking" should read --interlocking--

Column 5, Line 58, "Inside" should read --inside--

Column 5, Line 59, "that" should read --that,--

Column 5, Line 63, delete "p" before "It"

Column 6, Line 6, "38" should read --36--

Column 6, Line 30, insert --5,-- after "means"

Column 6, Line 31, "silt" should read --still--

Column 6, Line 57, "embossment" should read --embodiment--

Column 6, Line 62, "if" should read --it--

Column 6, Line 67, "torn" should read --from--

In the Claims

In Claim 11, Column 8, Line 27, "wail" should read --wall--

In Claim 15, Column 8, Line 41, "V-shaped" should read --Y- shaped--